US010852375B1

(12) United States Patent
Damadian et al.

(10) Patent No.: US 10,852,375 B1
(45) Date of Patent: *Dec. 1, 2020

(54) MAGNETIC RESONANCE IMAGING METHOD AND APPARATUS

(71) Applicant: FONAR Corporation, Melville, NY (US)

(72) Inventors: Raymond V. Damadian, Woodbury, NY (US); Gordon T. Danby, Wading River, NY (US); Hank Hsieh, Berkeley, CA (US); John W. Jackson, Shoreham, NY (US); Mark Gelbien, Levittown, NY (US); William H. Wahl, Smithtown, NY (US); Charles A. Green, Holbrook, NY (US)

(73) Assignee: FONAR Corporation, Melville, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/865,651

(22) Filed: Jan. 9, 2018

Related U.S. Application Data

(60) Continuation of application No. 15/174,671, filed on Jun. 6, 2016, now Pat. No. 9,864,027, which is a
(Continued)

(51) Int. Cl.
| | | |
|---|---|---|
| *G01V 3/00* | (2006.01) | |
| *G01R 33/3875* | (2006.01) | |
| *G01R 33/3815* | (2006.01) | |
| *G01R 33/30* | (2006.01) | |
| *G01R 33/58* | (2006.01) | |

(Continued)

(52) U.S. Cl.
CPC ....... *G01R 33/3804* (2013.01); *G01R 33/307* (2013.01); *G01R 33/3802* (2013.01); *G01R 33/387* (2013.01); *G01R 33/3815* (2013.01); *G01R 33/3873* (2013.01); *G01R 33/3875* (2013.01)

(58) Field of Classification Search
CPC .............. G01R 33/3875; G01R 33/307; G01R 33/3802; G01R 33/3804; G01R 33/3806; G01R 33/3815; G01R 33/387; G01R 33/3873
USPC .................................. 324/319, 318
See application file for complete search history.

(56) References Cited

U.S. PATENT DOCUMENTS

| | | | | |
|---|---|---|---|---|
| 4,899,109 A * | 2/1990 | Tropp | ................. | G01R 33/3875 324/319 |
| 5,305,749 A * | 4/1994 | Li | ........................ | A61B 5/0555 324/318 |

(Continued)

*Primary Examiner* — Rishi R Patel
(74) *Attorney, Agent, or Firm* — Raymond Van Dyke; Van Dyke Intellectual Prop Law

(57) ABSTRACT

A magnetic resonance imaging configuration and methodology to straighten and otherwise homogenize the field lines in the imaging portion, creating improved image quality. Through use of calibrated corrective coils, magnetic field lines can be manipulated to improve uniformity and image quality. Additionally, when the apparatus is composed of non-ferromagnetic materials, field strengths can be increased to overcome limitations of Iron-based systems such as by use of superconductivity. A patient positioning apparatus and methodology allows multi-positioning of a patient within the calibrated and more uniform magnetic field lines.

19 Claims, 9 Drawing Sheets

Related U.S. Application Data continuation of application No. 14/740,013, filed on Jun. 15, 2015, now Pat. No. 9,360,540, which is a division of application No. 13/763,093, filed on Feb. 8, 2013, now Pat. No. 9,057,769, which is a division of application No. 12/379,221, filed on Feb. 17, 2009, now Pat. No. 8,384,387.

(60) Provisional application No. 61/028,769, filed on Feb. 14, 2008.

(51) Int. Cl.
*H01F 6/04* (2006.01)
*H01F 6/06* (2006.01)
*G01R 33/387* (2006.01)
*G01R 33/38* (2006.01)
*G01R 33/3873* (2006.01)

(56) References Cited

U.S. PATENT DOCUMENTS

| | | | | |
|---|---|---|---|---|
| 6,097,187 A * | 8/2000 | Srivastava | ......... | G01R 33/3815 324/319 |
| 6,255,928 B1 * | 7/2001 | van Oort | ............ | G01R 33/3873 324/320 |
| 6,333,630 B1 * | 12/2001 | Holsinger | .......... | G01R 33/3806 324/319 |
| 6,853,281 B1 * | 2/2005 | Kakugawa | ......... | G01R 33/3806 324/319 |
| 9,864,027 B1 * | 1/2018 | Damadian | .......... | G01R 33/3802 |
| 2005/0077898 A1 * | 4/2005 | Nemoto | ............. | G01R 33/3806 324/318 |

* cited by examiner

MAGNETIC RESONANCE IMAGING METHOD AND APPARATUS

CROSS-REFERENCE TO PRIOR APPLICATIONS

This Application is a Continuation of U.S. patent application Ser. No. 15/174,671, filed Jun. 6, 2016, now U.S. Pat. No. 9,864,027, which is a Continuation of U.S. patent application Ser. No. 14/740,013, filed Jun. 15, 2015, now U.S. Pat. No. 9,360,560, which is a Divisional of U.S. patent application Ser. No. 13/763,093, filed Feb. 8, 2013, now U.S. Pat. No. 9,057,769, which is a Divisional of U.S. patent application Ser. No. 12/379,221, filed Feb. 17, 2009, now U.S. Pat. No. 8,384,387, which claims benefit of priority to U.S. Provisional Patent Application Ser. No. 61/028,769, filed Feb. 14, 2008. The disclosures of these applications and others referenced are incorporated herein by reference.

TECHNICAL FIELD

The present invention relates to magnets for magnetic resonance imaging apparatus, and to magnetic resonance imaging apparatus and methodologies incorporating those magnets.

BACKGROUND OF THE INVENTION

Magnetic Resonance Imaging (MRI) is a medical imaging technique commonly used in radiology to visualize internal body structures and functions, offering extraordinary tissue discrimination. Since its inception from the pioneering research efforts of Dr. Raymond Damadian, the advantages of MRI over other imaging techniques, e.g., computed tomography (CT), also known as Computerized Axial Tomography or CAT scanning and based on X-ray radiography, are many. For example, MRI provides much greater tissue contrasts and employs no ionizing radiation. These and numerous other advantages have made MRI the imaging tool of choice in medical diagnoses and treatment regimens.

In magnetic resonance imaging, the body of a subject is positioned in a primary field magnet and subjected to a strong, constant magnetic field. Radio frequency signals are applied to the subject, which causes the axes of certain atomic nuclei within the body of the subject, usually hydrogen atomic nuclei, to precess or rotate around axes parallel to the direction of the magnetic field. The precessing nuclei emit weak radio frequency signals referred to herein as magnetic resonance signals, which are collected and utilized in magnetic resonance imaging.

More particularly, by applying small magnetic field gradients to the subject along with the static magnetic field, particular magnetic resonance signals can be identified and spatially encoded so that it is possible to recover information about individual volume elements or "voxels" within the subject's body from the magnetic resonance signals. This information can be employed to reconstruct an image of internal structures within the body. Because magnetic resonance imaging is non-invasive and does not use ionizing radiation, it is inherently safe. Moreover, magnetic resonance imaging can provide excellent images depicting structures which are difficult to image using other modalities, e.g., the aforementioned X-rays, CAT scans and other imaging techniques.

In his research, Dr. Damadian found that diseased tissues, such as tumors, can be differentiated from normal tissue because the protons, e.g., in hydrogen nuclei, in different tissues return to their rest or equilibrium state at different rates. In other words, the relaxation times of the hydrogen nuclei in normal and diseased tissue differ markedly. Through modifying the parameters in an MRI scan this remarkable effect is employed to distinguish between varying tissue types in a body, providing a non-invasive and harmless window to internal body structures and functions. With more recent advances, functional MRI (fMRI) and other dynamic techniques have opened imaging further.

The quality of a magnetic resonance image strongly depends on the quality and homogeneity of the static magnetic field. To provide an optimum image, the static magnetic field must be both strong (typically on the order of 0.5 Tesla or more) and uniform to about 1 part in a million or better, more particularly to about one part in ten million or better. Some magnetic resonance imaging instruments employ air core superconducting static field magnets. As is understood in the art, these magnets typically have electromagnet coils formed from superconducting materials arrayed along an axis so that the coils cooperatively form an elongated solenoid surrounding the axis. In contrast to other types of MRI scanners, such as the UpRight® scanner made by Fonar Corporation, the coils are wrapped in close proximity to a patient-receiving space to reduce the Ampere turns required for a given field strength. The coils are cooled to cryogenic temperatures, typically about 4.2° Kelvin (approximately −267° C. or −450° F.) or perhaps higher temperatures with newer superconductive materials that can operate at higher temperatures. At cryogenic temperatures, however, the coils effectively have no electrical resistance. Liquid helium is often employed in such cryogenic systems, and the superconducting coils so cooled can conduct large electrical currents and provide a strong magnetic field. In fact, once the coils have been cooled to superconducting temperatures, electrical current flows without resistance and larger currents are possible.

Magnets of this type typically have a housing defining an elongated bore therethrough extending along an axis and require that the patient enter into this bore. The bore may be about 1 meter in diameter or smaller. Thus, the patient is subjected to a highly claustrophobic experience during imaging, akin to some as lying on a stretcher inside a drain pipe. Moreover, these "tube" devices typically cannot be used to image patients who are extremely obese, who require bulky life support equipment during imaging or are claustrophobic. More problematically, air core magnets of this design have strong magnetic fringe fields extending well outside of the magnet housing. These fields can attract ferromagnetic objects in the vicinity of the magnets with such strength that the objects can turn into deadly missiles. Despite stringent precautions taken by imaging centers to prevent entry of ferromagnetic objects into the danger zone surrounding a magnet, accidents have occurred, resulting in injuries and deaths. Some magnet designs wrap a reverse winding outside the primary or exciting winding to suppress fringing fields.

Iron core magnets, as their name suggests, use a ferromagnetic frame that defines a magnetic flux path, and usually include ferromagnetic poles projecting towards a patient-receiving space from opposite sides, such that the pole tips define the patient-receiving space between them. Because of the rather unique physical properties of elemental Iron, the ferromagnetic frame effectively eliminates the fringe field outside of the frame. Moreover, the ferromagnetic frame serves to better concentrate the primary magnetic field within the patient-receiving space and provides a low-reluctance flux path. Ferromagnetic frame magnets can provide the requisite field strength using essentially any source of magnetic flux, including superconducting coils, resistive coils, or masses of permanent magnet material.

One particularly desirable ferromagnetic frame magnet is disclosed in commonly-owned U.S. Pat. No. 6,677,753, the disclosure of which is hereby incorporated by reference herein. As disclosed in preferred embodiments of the '753 patent, the frame includes ferromagnetic side walls extending generally vertically and flux return structures extending generally horizontally above and below the patient-receiving space. Poles project from the side walls toward the patient-receiving space. As described in greater detail in the '753 patent and further hereinbelow, a patient may be positioned within the patient-receiving space in essentially any orientation relative to gravity, and may be moved relative to the frame so as to position essentially any part of the patient's body within the patient-receiving space in the vicinity of the magnet axis extending between the poles.

Preferred magnets according to this general structure can provide extraordinary imaging versatility. For example, a patient may be imaged lying in a recumbent, substantially horizontal position, and then imaged again while in a substantially vertical position, such as standing or sitting. Comparison of these images can yield significant information about certain conditions, e.g., in load-bearing situations. Also, these magnets provide an open environment for the patient, avoiding some of the more claustrophobic aspects. Although the tubular enclosures of prior systems offer simplicity in design, the physiological response of patients and aesthetics demand a better approach, which was championed again by Dr. Raymond Damadian in his UpRight® MRI system design and configuration.

As mentioned above, a ferromagnetic frame magnet can use any source of magnetic flux, including superconducting coils, and a magnet using superconducting coils in conjunction with the ferromagnetic frame can provide very high field strength with good uniformity. For example, U.S. Pat. Nos. 6,323,749 and 4,766,378, incorporated herein by reference, disclose particular arrangements for mounting superconducting coils on ferromagnetic frame magnets.

Despite all of this progress in the magnet art and increasing the field strength, still further improvement would be desirable. For example, as mentioned above, superconducting coils must be maintained at cryogenic temperatures, typically at the temperature of liquid helium (about 4.2° Kelvin or below). Typically, the coils are provided with refrigeration units referred to herein as cryocoolers, which can extract heat directly from the coil and from associated components even at this very low temperature, constituting immersion cooling. However, the cryocoolers have only a very limited capacity, typically on the order of a few watts or less at this temperature. Therefore, the coils themselves must be surrounded by very efficient thermal insulation material to remain effective. Most commonly, the coils are enclosed in vessels which are maintained under hard vacuum, by which the coolant can contact the coils. The coils must be supported and rigidly held in place within the vessels. The structures holding the coils must resist not only the weight of the coils but also the enormous magnetic forces generated during operations. Depending on the particular coil design and the design of any adjacent ferromagnetic frame elements, these forces can be on the order of tons. The coil vessel and supporting structure should also be compact so as to minimize the size and weight of the apparatus. Designing a compact coil enclosure and supporting system has presented a challenge to those of skill in the art.

Additionally, Applicants note that cryocoolers in operation, primarily due to their direct contact with the cooled component, typically induce mechanical vibrations. Transmission of such vibrations to the coils and associated structures tends to undermine the careful calibration of the coils and degrade the uniformity and stability of the static magnetic field. However, it is generally desirable to position portions of the cryocooler in proximity to the coil enclosure to better extract heat and maintain the superconductivity of the system. This, however, further complicates design of such a system. Additionally, although the benefits are substantial, the superconducting coils used heretofore typically have not been arranged for optimum co-action with the ferromagnetic frame. Thus, further improvements to combine and enhance such combinations would also be desirable.

Furthermore, Iron-based systems have functional limits in field strength that at present cannot be overcome, and as higher field strength systems become available with the decreasing cost and increasing temperature of superconducting materials, the inherent limitations of Iron-based systems prevents or hinders utilization of the newest technologies and imaging techniques employing greater and greater field strengths.

Whether having an air core or ferromagnetic frame, MRI devices that improve the image quality are desirable. By minimizing outlier fringe field lines and strenghthening the uniformity of the constant primary field lines, images can be improved, along with diagnoses.

There is, therefore, a need for reduced outlier fringe fields and improved uniformity of magnetic field lines at higher field strengths, whether employing air core, ferromagnetic or combinations thereof.

The present invention offers solutions to overcoming these problems and options to utilize the best of both paradigms.

SUMMARY OF THE INVENTION

The present invention provides an improved configuration and methodology to straighten and otherwise homogenize the magnetic field lines in the imaging portion of a magnetic resonance imaging apparatus. Through use of corrective coils magnetic field lines can be manipulated to improve uniformity and image quality. Additionally, when the apparatus is composed of non-ferromagnetic materials, field strengths can be increased to overcome limitations of Iron-based systems such as by use of superconductivity. A patient positioning apparatus and methodology allowing multi-positioning are also disclosed.

BRIEF DESCRIPTION OF THE DRAWINGS

The features, aspects, and advantages of the present invention will become better understood with regard to the following description, appended claims, and accompanying Drawings where:

DETAILED DESCRIPTION

The following detailed description is presented to enable any person skilled in the art to make and use the invention. For purposes of explanation, specific nomenclature is set forth to provide a thorough understanding of the present invention. However, it will be apparent to one skilled in the art that these specific details are not required to practice the invention. Descriptions of specific applications are provided only as representative examples. Various modifications to the preferred embodiments will be readily apparent to one skilled in the art, and the general principles defined herein may be applied to other embodiments and applications without departing from the spirit and scope of the invention. The present invention is not intended to be limited to the embodiments shown, but is to be accorded the widest possible scope consistent with the principles and features disclosed herein.

Figure 1:
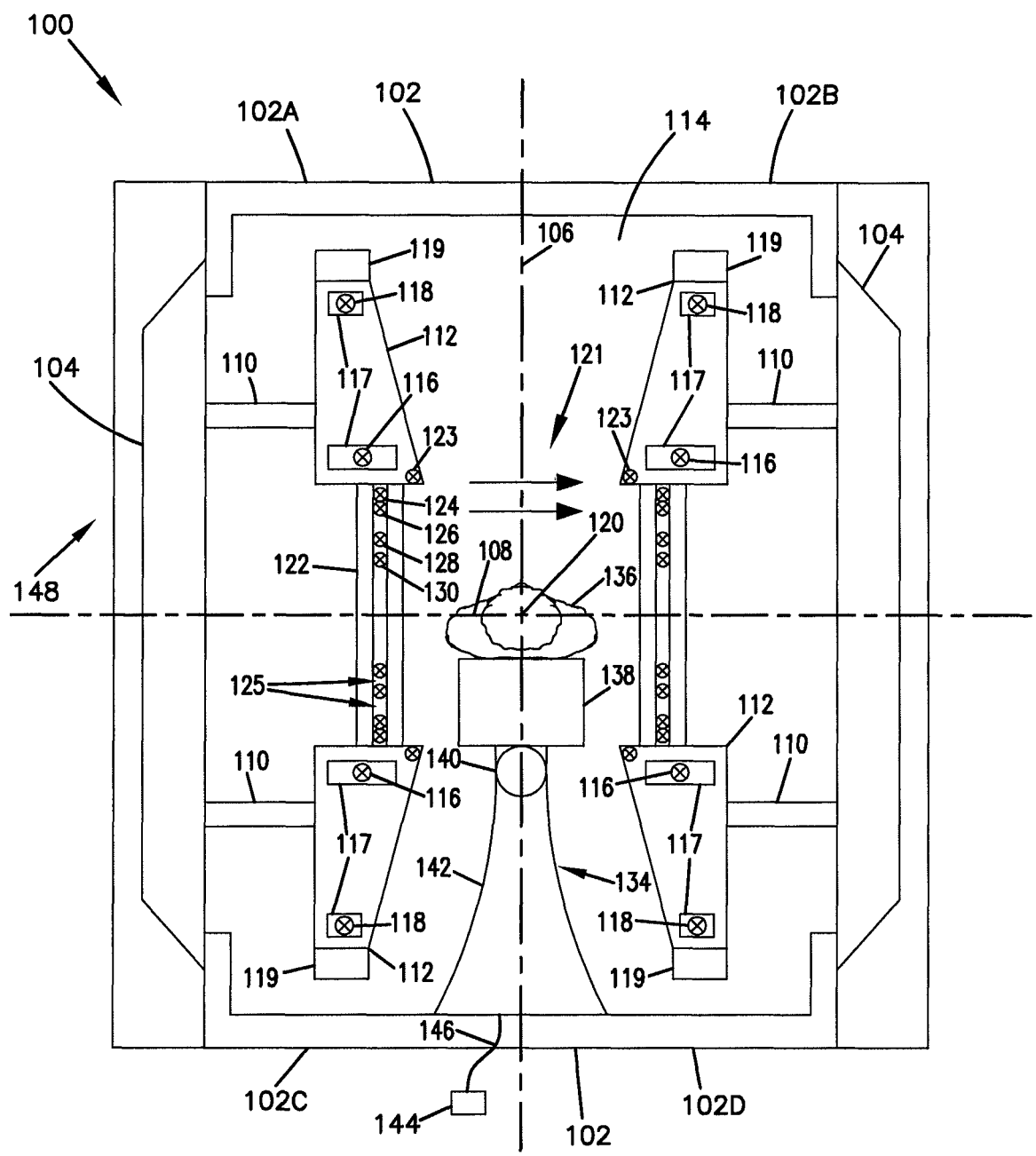
FIG. 1 is a front plan view of an embodiment of an apparatus pursuant to the teachings of the present invention.

With reference to FIG. 1 of the Drawings, there is illustrated a first embodiment of an air core design magnet assembly pursuant to the present invention, and generally designated therein by the reference numeral 100. As shown in FIG. 1, the apparatus assembly 100 has compression members 102 along the top and bottom and support plates 104 along the sides, which all serve to interconnect and secure the assembly 100 despite the presence of strong magnetic fields. The apparatus or system components are aligned with respect to a vertical axis, generally designated by the reference numeral 106, and extending along the Y axis, and a medial or polar axis, generally designated by the reference numeral 108 and extending along the X axis. Extending from the support plates 104 are a number of supports, generally designated by the reference numeral 110, that align coil units, generally designated by the reference numeral 112, within the interior cavity or patient-receiving portion of the structure, generally designated by the reference numeral 114, and aligned about axes 106 and 108. It should be understood that supports 110 preferably provide support for the coil units 112, but more particularly only the coils therein and not support for cryostatic devices, which have alternate structural support, as also described and illustrated in connection with FIGS. 3 and 4 hereinbelow. It should also be understood that the supports 110 may function as tension or compression supports, as is understood to those of skill in the art.

It should further be understood that although the principles illustrated here in this embodiment are typically directed to an upright or vertically-oriented device for positioning of a patient within the cavity 114, other MRI scanner configurations are contemplated. More particularly, placing the patient about a patient-receiving portion or field of view, generally centered about a patient point, centered three-dimensionally within the assembly 100 and generally designated by the reference numeral 120, the teachings of the present invention are also applicable to devices allowing a variety of patient position states by orienting the scanner to other coordinates, as is understood by those of skill in the art and described further hereinbelow.

With further reference to FIG. 1, there are shown a variety of coils within the coil units 112 that generate the aforementioned constant magnetic field and also enable better control of the increased field strengths generated by the apparatus of the present invention, e.g., the aforementioned deleterious fringe fields. A primary coil, more particularly a pair of primary coils, designated by the reference numeral 116, predominately generates the scanning dipole field used in magnetic resonance imaging. As is known in the art and described in more detail hereinabove, large fields so generated between the magnet poles have fringe lines that extend outwards for some distance. By inclusion and careful placement of a second pair of coils, designated by the term "secondary coils" and the reference numeral 118, far field effects are thereby ameliorated or canceled. As is understood in the art, to accomplish this cancellation the ampere turns (NI) of the secondary coils 118 are typically 20% of the ampere turns (NI) for the primary coils 116.

As noted, both the primary 116 and secondary 118 coils are preferably within respective coil units 112, for ease in configuration, but may instead be separate components and calibrated dynamically. It should be understood that the primary 116 and secondary 118 coils in the coil unit 112 may alternatively be pre-calibrated for optimum performance and later installed as a unit. These coils are cooled, e.g., by cryocoolers attached to or within the coil units 112, generally designated by the reference numeral 119. Also, the support structures, e.g., the supports 110 in this embodiment, support the primary 116 and secondary 118 coils alone, as illustrated. Preferably, additional support is provided for the structure, for example, the aforementioned cryostats and the associated cooling apparatus and interconnectivities with the magnetic coils, which, as shown illustrated and described in connection with the embodiment shown in FIGS. 3 and 4, have separate additional structural support for the cooling apparatus. Preferably, the supports thwart heat transfer between the surrounding structures and the cryocoolers 119, minimize vibrating damage, and otherwise prevent the large magnetic forces of attraction generated by the super-cooled coils from tearing the apparatus apart. The structure of the cryocoolers 119 and their operational features are further described in U.S. Pat. No. 4,766,378, incorporated by reference herein.

With further reference to FIG. 1, the compression members 102, which are preferably at room temperature, serve to hold the end plates 104 apart and also support the separation of the coil units 112 across the polar axis 106 direction. More particularly, in a preferred embodiment of the present invention, there are four such compression members 102, two at the top and two at the bottom, e.g., 102A, 102B, 102C and 102D, which govern the end plate 102 gap distance. As shown, the compression members 102 are widely separated across the vertical axis 106, leaving full access to the cavity 114 over a large angle, permitting patient positioning. In particular, the assembly 100 so configured in a preferred embodiment allows frontal access from the front and back, i.e., along the Z axis perpendicular to the page of FIG. 1, and at a patient point, designated hereinabove by the reference numeral 120. With the patient access volume within cavity 114 between the coil units 112 completely unobstructed, a rotatable and translatable patient bed or other patient movable support system therein would permit patient scanning while they were standing, sitting or lying down. As should be clear, a bed so situated is rotatable about the medial X axis 108 to any angle, as described in more detail hereinbelow.

With additional reference to FIG. 1, the recent development of very high current density, high temperature, superconducting materials, which can be cooled by more cost-effective cryocoolers, enables higher current capacities at higher operating temperatures, and makes the configuration of the present invention a reality. Prior attempts for such high field air core devices that Applicants are aware of either failed or were entirely unfeasible due to their paradigm of operation and technological constraints. The technological advances of late, however, enhance the paradigm and Applicants set forth herein a new approach that maximizes the advantages of these technologies, while minimizing the previously overwhelming disadvantages that thwarted the earlier usage of larger field strengths, particularly with an air core design.

With reference again to FIG. 1 of the Drawings, in a preferred embodiment of the present invention, the primary coils 116 are Helmholtz-like ring coils that produce the primary field, generally designated by the reference numeral 121, and are aligned about the X axis 108 and transverse the Y axis 106. The secondary coils 118 are preferably a pair of bucking ring coils with a larger diameter than that of the primary coils 116 to help suppress the far leakage, as described and shown hereinbelow in more detail. As discussed, the coils of the secondary coil pairs 118 are typically wound about 20% of the primary Ampere turns to best counter fringing fields produced by the primary coils 116. It should be understood that by so minimizing the number of Ampere turns, one also minimizes the amount of expensive superconducting material required in the magnet structure, along with potential load issues associated with the maximum current-carrying capacity of a given superconductivity wire.

Whereas Iron-based or ferromagnetic magnets pole surfaces control the field precision due to the presence of large amounts of carefully-machined Iron, the air core design set forth herein, lacking the inherent ferromagnetic controls, requires additional control to better fine tune the higher fields produced solely by the use of the superconducting materials. More particularly, the improved air core design set forth herein allows better control of the constant magnetic field lines in the patient scanning area within the cavity 114, producing better uniformity therein. Pursuant to the presently-claimed invention and as shown in FIG. 1, a correction coil unit, generally designated by the reference numeral 122, is preferably located within the diameter of the primary coils 116 to provide additional corrective measures to the constant magnetic field lines.

Applicant has found that a number of auxiliary corrective coils are required to provide a mechanism to make the homogenous uniform field corrections necessary to smooth out any remaining field inhomogeneities, particularly in the patient scanning area, particularly about the patient point 120, the center of the patient scanning area or imaging field of view. For example, in the embodiment shown in FIG. 1, there are four such coils illustrated, generally designated by the reference numerals 124, 126, 128 and 130, respectively. It should nevertheless be understood that fewer or more such corrective coils may be positioned and employed to improve the scanning quality and uniformity within the patient scanning area, particularly about point 120, e.g., two, three, four or perhaps five or more such coils may be used. As with the coil units 112, the correction coil units 122 may be pre-calibrated to address inhomogeneities due to the primary coil 116, the secondary coil 118, higher currents and field strengths, and combinations thereof. Alternatively, the respective correction coils may be configured and calibrated dynamically in situ.

Figure 2:
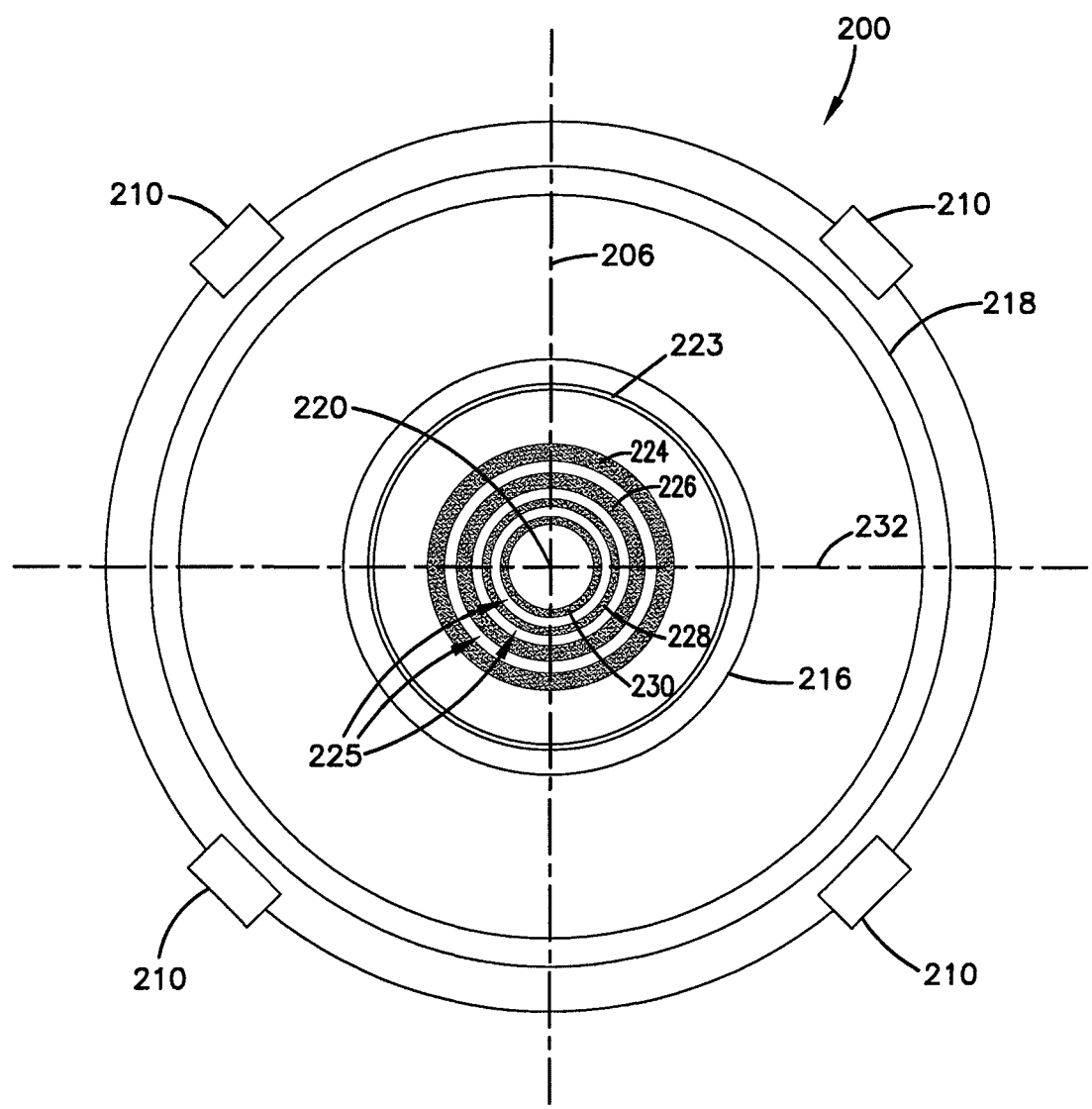
FIG. 2 is a side plan view of the apparatus shown in FIG. 1 in cross section.

With reference now to FIG. 2 of the Drawings, the aforementioned assembly or apparatus of FIG. 1 is shown from the side, i.e., along the polar or X axis 108 and in cross section, e.g., about the Y axis 106, to show the various coil unit 112 and corrective coil unit 122 components discussed hereinabove. Units 112 and 122 are not expressly shown in FIG. 2 to simplify the description, but their respective components are. The illustrated assembly, generally designated in FIG. 2 by the reference numeral 200, includes supports 210 disposed to support the aforementioned coil units 112 and 122 and components thereof. As discussed, supports 210 may be tension or compression supports. As shown in FIG. 2, inner primary coils 216 and the calibrated outer secondary coils 218 generate and control, respectively, a magnetic field, with the secondary coil 218 calibrated to control outlier fringe fields caused by the primary coil 216. Corrective coils 224, 226, 228 and 230 are also illustrated, which are isocentrically-aligned about a patient point 220 and which further govern the high intensity field generated by the superconductive materials in the primary coils 216. Also shown in FIG. 2 is the Z axis, generally designated by the reference numeral 232, which is perpendicular to the Y axis 206 shown in the figure. The aforementioned X-axis 108 is perpendicular to the page, about said patient point 220.

As noted in FIGS. 1 and 2, the various correction coils 124/224, 126/226, 128/228 and 130/230 in correction coil unit 122 are concentrically or isocentrically disposed within the windings of the primary coils 116 and about patient point 220 (along X-axis 108). Since the constant magnetic field lines across the patient scanning area within the cavity 114, generally illustrated in FIG. 1 by the reference numeral 121, must be uniform, e.g., to one part in ten million or more, the corrective coil units 122 and the respective coils therein are employed to fine tune the primary field lines to maximize uniformity. As is understood in the art, the concentric position of a respective corrective coil attenuates noise and otherwise smooths the primary field lines. In concert, the four corrective coils in unit 122 illustrated in this embodiment facilitate uniformity in high primary field strengths, e.g., 1.5 Tesla or more. As discussed, other numbers of corrective coils may be employed to best control field uniformity.

It should be understood that the spacings between the respective corrective coils within the units 122 and their proximity to the primary coil 116/216 are adjustable to better correct any inhomogeneities within the magnetic field lines 121, whether by pre-calibration or dynamic adjustment. One skilled in the art can readily adjust these spacings, generally designated by the reference numeral 125/225, to accomplish the field line uniformity goal. For example, a technician could tighten or loosen a corrective coil to better conform or swap out a particular corrective coil or entire units 122 for one of a different size or configuration, thereby adjusting the uniformity by adjusting the spacings 125/225 within a unit or replacing entire units with ones leaving appropriate spacings. Additionally, the respective corrective or correction coils can be adjusted in other ways to better address the inhomogeneities in the primary field, e.g., the amount of current flowing through the respective coils can be adjusted, thereby providing an adaptable means to fine tune the primary field lines.

It should further be understood that the aforementioned positions and electrical current strengths of the secondary coils 118/218, and the correction coils within that of the primary coil 116/216 may be precomputed and constructed pursuant to those calculations, as discussed. Alternatively, the secondary coil and correction coil positions and electrical current strengths can be ascertained dynamically. In view of the sensitivity of the field uniformity adjustments, Applicants believe that their approach provides sufficient flexibility to adjust and obtain a uniform constant magnet field and, with monitoring and appropriate corrective coil adjustments, maintain that primary field uniformity, and attenuate outlier fringe fields as well. Low current room temperature magnetic coils or shims may also be used for final very small field adjustments as discussed in more detail hereinbelow.

It should be understood that superconducting coils, such as the aforementioned primary 116/216 and secondary 118/218 coils in this embodiment, are cryogenically cooled in a bath of liquid helium inside a cryostat, generally designated by the reference numeral 117. As shown, the cryostats 117 contain the coils 116 and 118. Thus, liquid helium is in direct contact the coils. As is understood in the art, the cryocoolers 119 convert gaseous helium generated by thermal sources present in the system, back to a liquid state.

It should be understood that other mechanisms for cooling may be employed. For example, thermal siphoning and conduction cooling are accomplished through the use of a narrow tube containing liquid helium. The narrow tube connects to the superconducting coils through a medium such as copper. Conduction cooling of the superconducting coils occurs through this connection which thereby removes heat from the system. Any heat generated by the coils or otherwise conducted into the cryostat is thus removed. Additional modes of extracting heat and otherwise maintaining superconductivity of the operational components are also contemplated.

It should also be understood that although the aforementioned primary 116/216 and secondary 118/218 coils are preferably made of superconductive materials and are operationally superconductive, other configurations are contemplated in the present invention.

It should also be understood that although aforementioned corrective coil units 122 are preferably superconducting, other non-superconducting embodiments are contemplated in the present invention. For superconducting embodiments, the corrective coils within the unit 122 will reside in a cryostat and must also be connected with a cryocooler. As set forth and described hereinabove alternative methods to achieve cooling adequate to maintain superconductivity of the corrective coils may be employed.

With further reference to FIGS. 1 and 2, additional corrective measures may be taken to further smooth the field lines and otherwise improve image quality. For example, a shim, generally designated in the figures by the reference numerals 123/223, respectively, may be added to further homogenize the field lines 121 and which may contain a plurality of shim coils therein, as is understood in the art. Furthermore, as shown in FIG. 1, the shims 123 are preferably adjacent the correction coil unit 122 and closer in the direction toward the Y-axis 106 to better attenuate inhomogeneities. It should be understood that shims 123 operate at room temperature and are not superconducting. As such they operate at low currents, and are useful for very small or fine adjustments, augmenting the gains of the correction coils, which may operate at superconducting temperatures. Although only one shim 123/223 is shown in the figures, it should be understood that several such shims may be isocentrically arranged to further refine the field line homogeneity. As with the other coils, the shim 123/223 configurations and arrangements can be ascertained dynamically or pre-computed.

Also shown in FIG. 1 is a patient moveable support system, generally designated by the reference numeral 134, and a patient 136 thereon. As shown in FIG. 1, the patient 136 is within the cavity 114 and at the patient point 120. The patient 136 may, however, be raised vertically to be within another region adjacent the patient point 120 (or in a patient-receiving area thereabout) for imaging. Alternatively, the patient 136 may be tilted or rotated or translated about the X 108, Y 106 and/or Z 232 axes for imaging an area of interest at an angle or orientation of choice, as is understood to one of skill in the art. Further details and mechanisms to so maneuver a patient within the cavity 114 are set forth and illustrated in Applicants' assignee's patent application, U.S. patent application Ser. No. 09/918,369, filed Jul. 30, 2001, which refers to U.S. patent application Ser. No. 08/978,084, filed Nov. 25, 1997, both of which are incorporated herein by reference.

As shown in FIG. 1, the patient moveable support system 134 has a variety of components necessary to import the flexibility of movement and maneuverability to situate the patient 136. By virtue of the strong fields present, the system 134 cannot contain ferromagnetic materials and suffers operational problems, as discussed in more detail hereinbelow. A bed 138 in addition to supporting patient 136 thereon, also has interconnections that permit the requisite movement. A drive or motor 140 provides the energy for the horizontal, vertical and angular movements across the three axes. A support 142 connects the system 134 to the assembly 100 and enables the translational and rotational movements. As shown, the system 134 can move in and out of the cavity 114, along a transverse direction in FIG. 1 along the Z axis 232, as well as rotate about the axes in any combination thereof. Although many components of the system enter the cavity 114, many do not, and are illustrated by exterior component 144, connected to the system 134 by a connector 146. Further details and a presently preferred embodiment of the patient moveable support system 134 are set forth herein below.

It should be understood that the patient moveable support system 134 described allows the multi-positional placement of an anatomical region of interest of a patient within the patient-receiving portion of an imaging field. The advantages of the system 134 so described are that the patient 136 can be positioned not only horizontally as shown, but vertically, sitting down, rotated, translated and otherwise oriented about the X, Y and Z axes and combinations thereof, in an effort to obtain an image of the region of interest.

Figure 3:
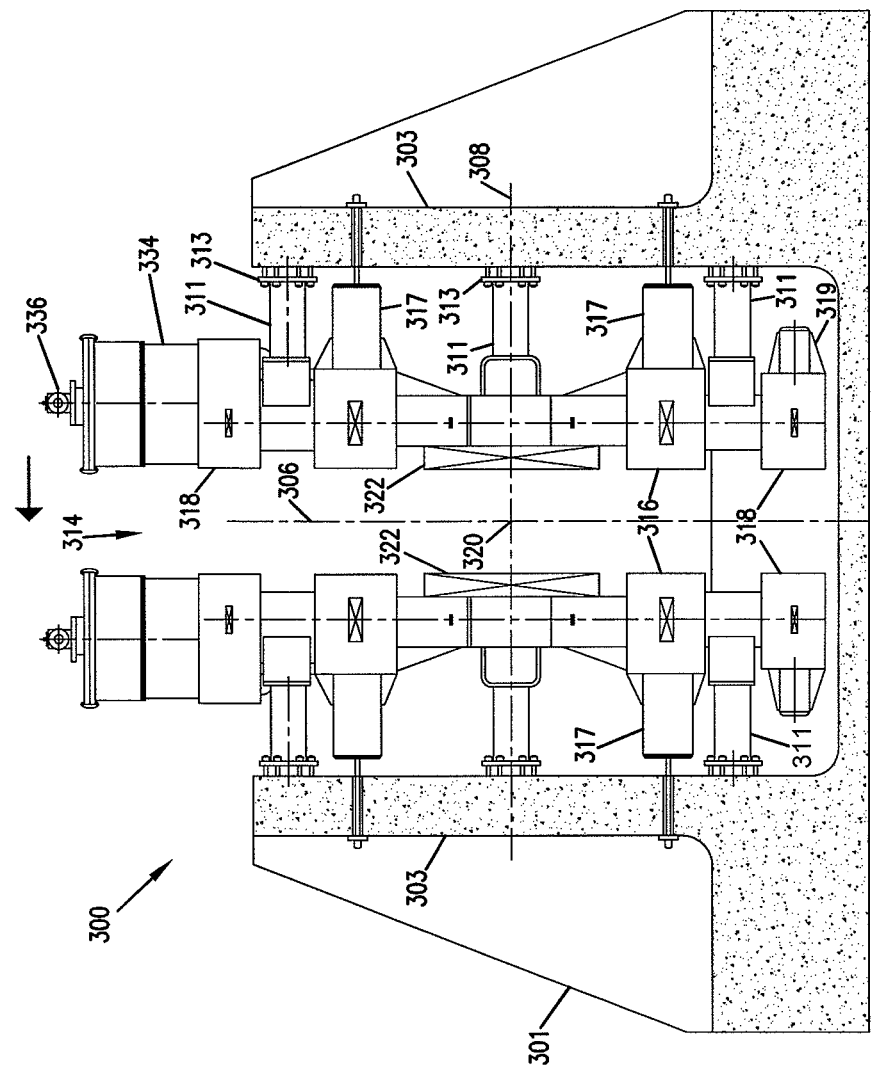
FIG. 3 is a front plan view of another apparatus pursuant to the teachings of the present invention.

With reference now to FIG. 3 of the Drawings, there is illustrated another Iron-less configuration of the present invention, e.g., for use with superconductive materials, and generally designated by the reference numeral 300. Instead of the interlocked frame structure, illustrated and described in connection with FIGS. 1 and 2, however, the embodiment shown in FIG. 3 (as well as FIG. 4) illustrates a strong frame construction employing a non-ferromagnetic material, such as concrete. It should, of course, be understood that alternate non-ferromagnetic materials may also be used, in whole, in part or in combination, such as aluminum.

As illustrated, a concrete or otherwise substantially non-ferromagnetic material is employed as an anchor, primarily because of the weight of the material but also because of its strength to withstand the immense magnetic forces engendered during operation. Attached to the anchor, generally designated by the reference numeral 301, are various connectors and positioners for the MRI apparatus components. As with the apparatus shown in FIG. 1, the components in this embodiment are also aligned with respect to a vertical axis, generally designated by the reference numeral 306 and extending along the Y axis, and a medial or polar axis, generally designated by the reference numeral 308 and extending along the X axis.

As shown in FIG. 3, anchor 301 has side walls 303 extending vertically. Attached to the side walls 303 are various supports 311, 317 and 319 that securely fasten all of the magnet assembly components to the anchor 301, but in a preferred embodiment the supports support different components, e.g., support 311 the non-magnetic components, and supports 317 and 319 the magnetic components. As shown, one support 311 is aligned along the X axis 308 and two others are arranged radially therefrom and parallel therewith. All of the supports 311 are firmly fastened to the anchor 301 by bolts or other fastening means, generally designated by the reference numeral 313. It should, of course, be understood that more or alternate fasteners 313 than that illustrated and described may be employed in an effort to best secure the components for the heavy weights and torsional stresses to come during operation.

It should be understood that the supports 317 and 319 preferably support only the primary 316 and secondary 318 coils, as with the aforedescribed supports 110, and that other stresses and forces are handled by additional structural supports such as the aforementioned supports 311 and fasteners 313.

Also shown in FIG. 3 are a primary coil 316 and a secondary coil 318, pairs of which are aligned about a patient-receiving area or cavity 314. As discussed, primary coil 316, more particularly a plurality of discrete interwoven or adjacent primary coils constituting the bundle forming the particular coil, generates a constant magnetic field between the magnet poles and through the cavity 314 for imaging a patient therein. Fringe lines resulting from that primary field are controlled by the secondary coils 318, as discussed in more detail hereinabove and illustrated hereinbelow. Structural support for the magnetic components is provided by a primary magnetic load transfer device and a secondary magnetic load transfer device, designated by the reference numerals 317 and 319, respectively, for the primary magnet coil 316 and the secondary magnet coil 318, respectively. As illustrated, the weight load of the affiliated apparatus, such as cryostats and cryocoolers, is preferably handled by the aforementioned structural supports 311, which are securely affixed to the anchor walls 303 by the fasteners 313, thereby alleviating some gravitational or other pressure on the aforementioned supports 311 and better securing the entire apparatus. It should be understood that supports 311, 317 and 319 may function as tension or compression supports, as is understood in the art.

Atop the assembly described above are service turrets 334 and cryocoolers 336. It should be understood that the cryocoolers 336 provide sufficient coolant to enable superconductivity of the various wires employed, e.g., the primary coil windings 316, the secondary coil windings 318 and the various corrective coil windings. A corrective coil unit housing the correction coils is generally designated in FIG. 3 by reference numeral 322. The coolant, such as liquid helium or perhaps in future liquid nitrogen with higher temperature superconductors, circulates around the windings to bathe the respective coils and cool them to enable superconductivity. Additional details on the implementation of a cryogenic system can be found in Applicants' assignees' U.S. Pat. No. 4,766,378, which is incorporated by reference herein.

Figure 4:
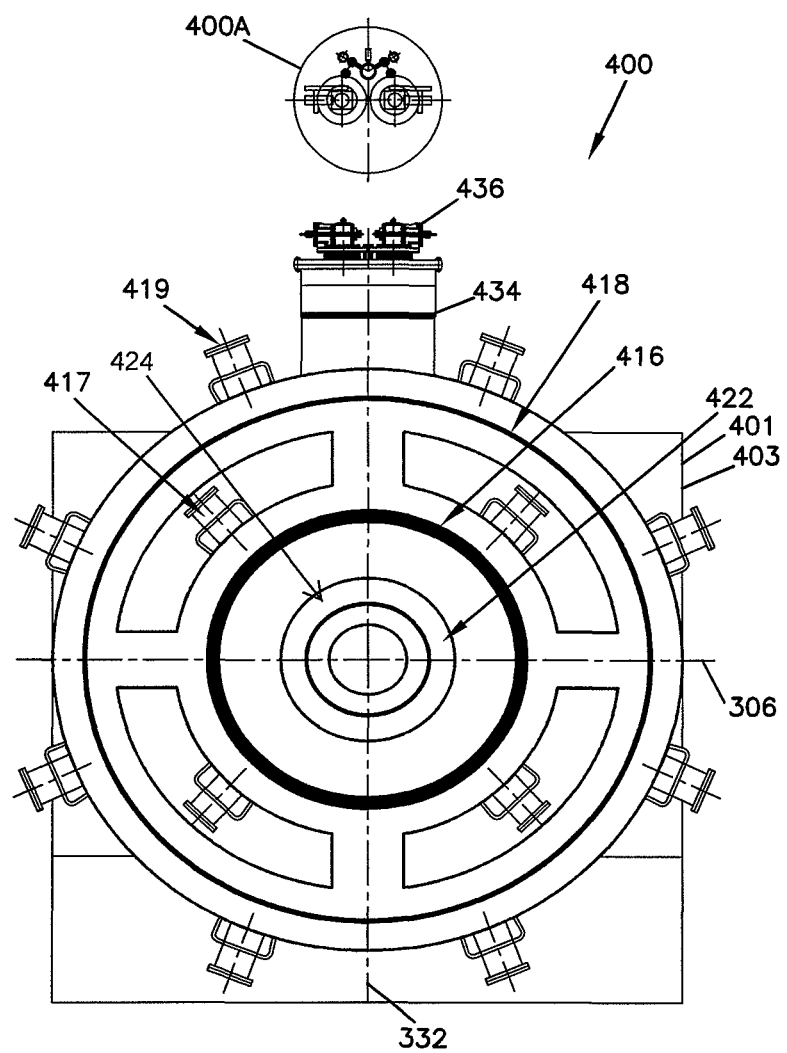
FIG. 4 is a side plan view of the apparatus shown in FIG. 3 in cross section.

With reference now to FIG. 4 of the Drawings, the aforementioned assembly of FIG. 3 is shown from the side, i.e., along the polar or X axis 308 and in cross section, e.g., about the Y axis 306. The illustrated assembly, generally designated in FIG. 4 by the reference numeral 400, includes an anchor 401, a sidewall 403 thereof, a primary coil 416, a secondary coil 418 and a correction coil unit 422, arranged in a package and as described hereinabove in connection with the correction coil unit 322 embodiment shown in FIG. 3. Also shown in FIG. 4 is the Z axis, generally designated by the reference numeral 332, which is perpendicular to the Y axis 306 shown in the figure. Also shown are primary and secondary magnetic load transfer devices 417 and 419, respectively, which transfer some of the assembly load to the anchor walls 303 and particularly support the respective magnets, as discussed hereinabove. It should also be understood that although concentrically and radially equi-spaced devices 417 and 419 are shown, fewer or more can be employed, as needed for support, and in alternative configurations.

Also shown in FIG. 4 are a service turret 434 and a pair of cryocoolers 436, with a top view thereof also illustrated and generally designated by the reference identifier 400A. It should, of course, be understood that the particular placements of the aforementioned components can be variable and dependent upon the particularities of a given installation and its requirements. For example, alternate or additional cryocoolers can be employed to better support superconductivity and avoid potential problems associated with cryogenics, e.g., quenching.

It should be understood that shims 123, as described and illustrated in connection with FIGS. 1 and 2, may also be employed in this embodiment to further govern the field lines and facilitate uniformity. Similarly, the patient-positioning device 134, also described and illustrated in connection with FIG. 1, may be employed within the cavity 314 to maneuver a patient for optimal imaging.

It should be understood that the Iron-less configurations shown in FIGS. 1-4, although offering many advantages as they are, may be modified, e.g., in the materials used. More particularly, since Iron is not employed for the support plates 104, some other resilient material, e.g., aluminum may be used instead. This would suffice to serve the purpose of keeping the coil units 112 from deflecting to each other, e.g., massive support members functioning as end plates 104 made in part or in whole of concrete may be employed, as set forth in the embodiment shown in connection with FIGS. 3 and 4. Such heavy and strong concrete pillars or side walls 303 could mean that interconnection across the top and bottom, e.g., the compression members 102, would not be required, and such longitudinal connectivity across the patient scanning region would not be required.

Additionally, Applicants in their long association with the MRI industry have learned that some purchasers of MRI equipment with rather stringent siting requirements cannot consider ferromagnetic devices due to their immense weight. As noted, however, the special susceptibility flux properties of Iron make MRI field control easier. For example, as the field strengths increase, such as now commercially feasible with lower temperature superconductive materials, even more Iron would be required to govern the fields, so much so that severe weight issues may arise, making floor reinforcement and other protective measures prohibitively expensive. Nonetheless, even with Iron, there is a roughly 1.5 Tesla limit with configurations fully reliant upon Iron, making greater field strengths problematic at best. Thus, non-ferromagnetic solutions are required and hybrid solutions feasible to obtain the best of both configurations.

Figure 5:
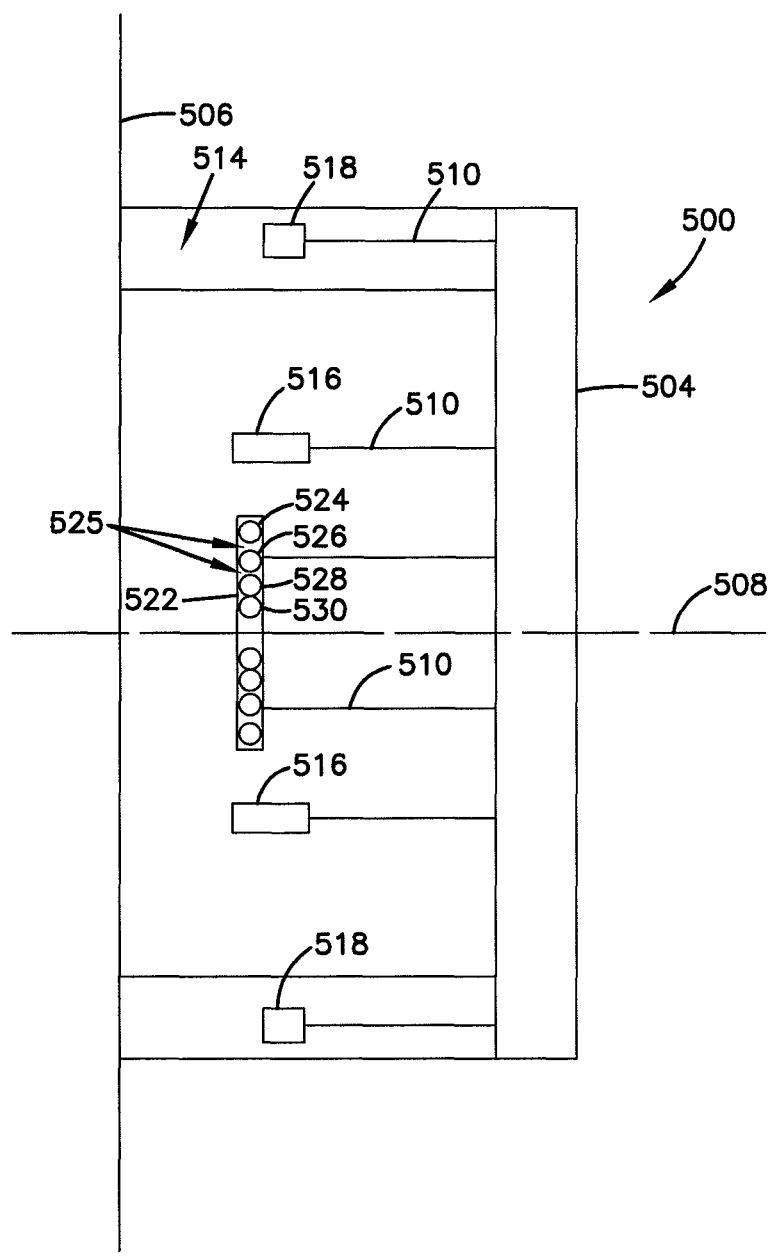
FIG. 5 is a front plan view of an alternate embodiment of an apparatus pursuant to the teachings of the present invention employing Iron.

With reference now to FIG. 5 of the Drawings, there is shown an alternate embodiment of the above assembly illustrated in cross section and along only the right half of the configuration, i.e., right of the Y axis 506. As shown, this alternate construction, generally designated by the reference numeral 500, employs Iron as part of the configuration, enhancing the field control somewhat, e.g., by controlling leakage fields along the medial or X axis 508. Indeed, a hybrid design of this sort produces a somewhat field sensitive field shape, and better suppresses leakage fields along the medial or X axis 508 beyond the scanner apparatus end plates 504, which in this embodiment are the components composed of Iron. The supports 510 support a primary coil 516, a secondary coil 518, and a number of corrective coils 524, 526, 528 and 530, for example, in a corrective coil unit 522. As discussed, the support 510 may be a tension or compression support, as is understood in the art. Also, the corrective coils are separated from one another by spacings 525, which govern aspects of the field line uniformity, as discussed hereinbelow. Through use of the Iron end plates 504, a higher central field ($B_0$), as illustrated and described in connection with the field lines 121 in FIG. 1, is possible for the same magnet currents, and the attractive forces between the coil units 522 across the vertical midplane and across a patient-receiving area or cavity 514 are reduced significantly.

Applicants believe that this alternate assembly depicted in FIG. 5 can support field strengths in excess of about 1.5 Tesla, as well as field strengths less than this, e.g., less than 0.5 T, 0.5 T-1.0 T, 1.0 T-1.5 T, and above 1.5 T, e.g., 1.5 T-2.0 T, 2.0 T-2.5 T, 2.5 T-3.0 T, 3.0 T-3.5 T, 3.5 T-4.0 T, and above 4.0 T, as well as 3.0 T-3.1 T and 3.1 T-3.2 T. Similar strengths are possible with the other embodiments also.

Applicants note that the particular locations of the magnet coils shown in the figures are not unique in these configurations and may be adjusted for alternate or particular implementations and imaging requirements. Indeed, the location of the shielding coils, i.e., the secondary coils 318, in FIG. 3, or the secondary coils 518, in FIG. 5, may be along the medial or X axis 308 with about the same radial distance from the X axis as the primary coil 316, as per the fringe field reduction calibrations. Alternatively, the secondary coils 318 can be located at an angle in the XY plane, as is understood in the art. In any event, the embodiments shown in the figures are particularly well suited for use as an UpRight® scanner, i.e. a scanner made by Fonar Corporation where patients can stand or otherwise be upright instead of prone during scans, as well as other like manufacturers.

It should be understood that shims 123, as described and illustrated in connection with FIGS. 1 and 2, may also be employed to further govern the field lines and facilitate uniformity in this embodiment of the present invention. Similarly, the patient-positioning device 134, also described and illustrated in connection with FIG. 1, may be employed within the cavity 514 for this embodiment employing Iron in the frame of the assembly to better control outlier fringe fields.

Figure 6:
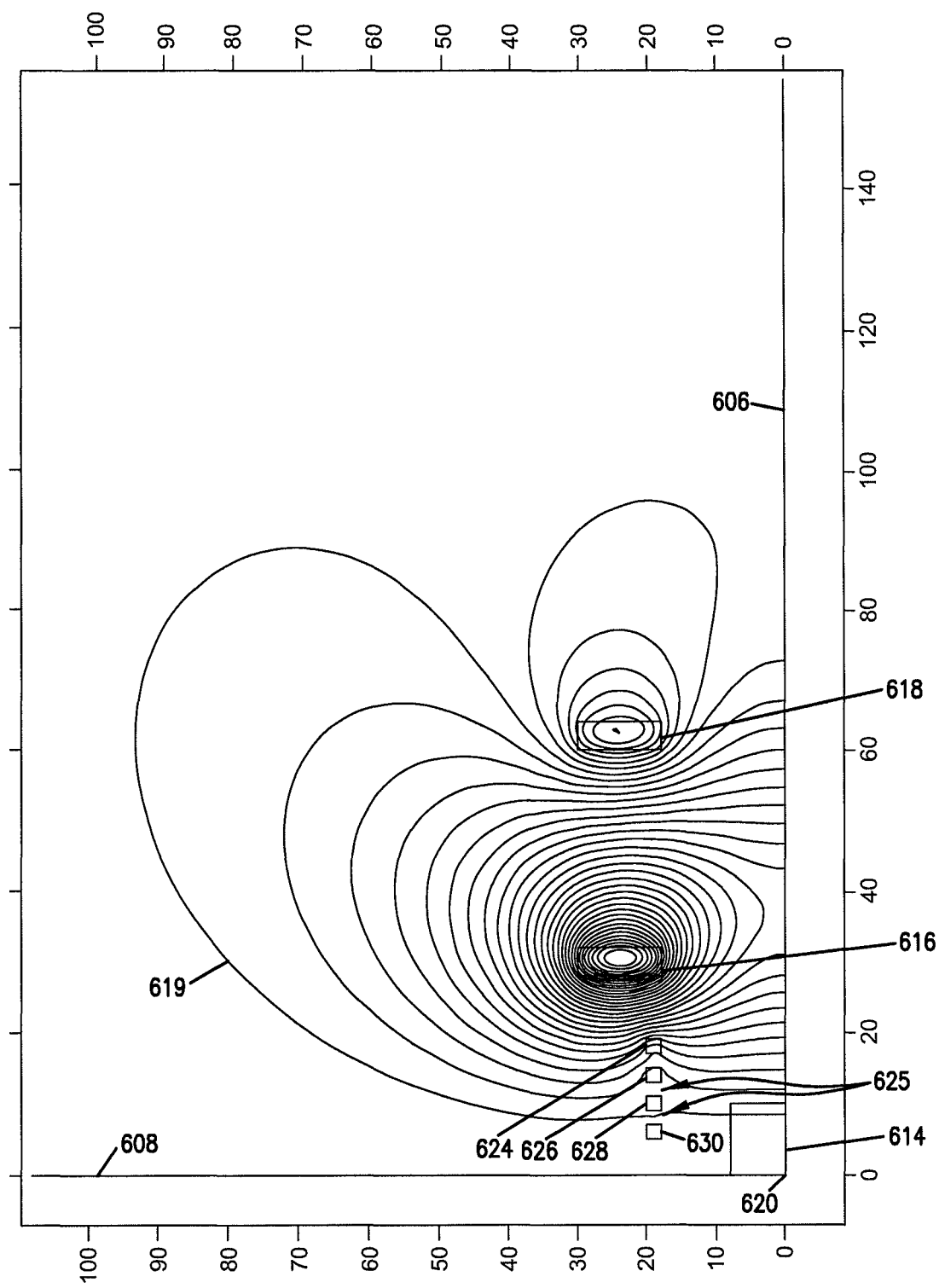
FIG. 6 is a first illustration of field lines produced in an embodiment of the present invention such as illustrated in FIGS. 1-4.

With reference now to FIGS. 6-9 of the Drawings, there are illustrated a variety of field intensities corresponding to the configurations set forth in FIGS. 1-5 that handle those fields pursuant to the teachings of the present invention. With particular reference now to FIG. 6, there is shown a field configuration for an air core design, i.e., with no Iron employed, such as those illustrated and described in connection with the embodiments of FIGS. 1-4, which may employ superconductivity. In particular, the image in FIG. 6 dynamically shows a quadrant of the machine of FIG. 1, more specifically the magnetic field lines resulting in the upper left quadrant of the figure above the medial or X axis, designated in the figure by the reference numeral 608 and to the left of the Y axis 606, which corresponds to the geometric quadrant II, generally designated in FIG. 1 by the reference numeral 148. Also shown in FIGS. 6-9 are the distances in inches from the central patient point of components and field lines for that quadrant.

As shown in FIG. 6, the two poles of the field shown in FIGS. 6-9 are a primary coil 616, which is the lower coil in the figure, and a secondary coil 618, which is the upper one, the configurations of which are also illustrated hereinabove in FIGS. 1-5. As shown in FIG. 6, the field lines or flux, generally designated by the reference numeral 619, extends outward considerably, i.e., leftward from the coils along the medial or X axis 608 and upward along the vertical or Y axis 606. Additionally shown in FIGS. 6-9 are the aforementioned corrective coils, e.g., coils 624, 626, 628 and 630, with spaces 625 therebetween, which further modify the field lines employed in MRI, particularly, those lines adjacent a patient point 620 and a patient receiving area or cavity, generally designated by the reference numeral 614, increasing the homogeneity and uniformity of the constant primary magnet field lines and the image resolution. With particular reference to FIG. 6, the field lines passing through the corrective coils are straightened somewhat when entering the aforementioned cavity 614 portion and in the space thereabouts, as shown. It should be understood that only a small number of field lines are shown to simplify illustration.

Figure 7:
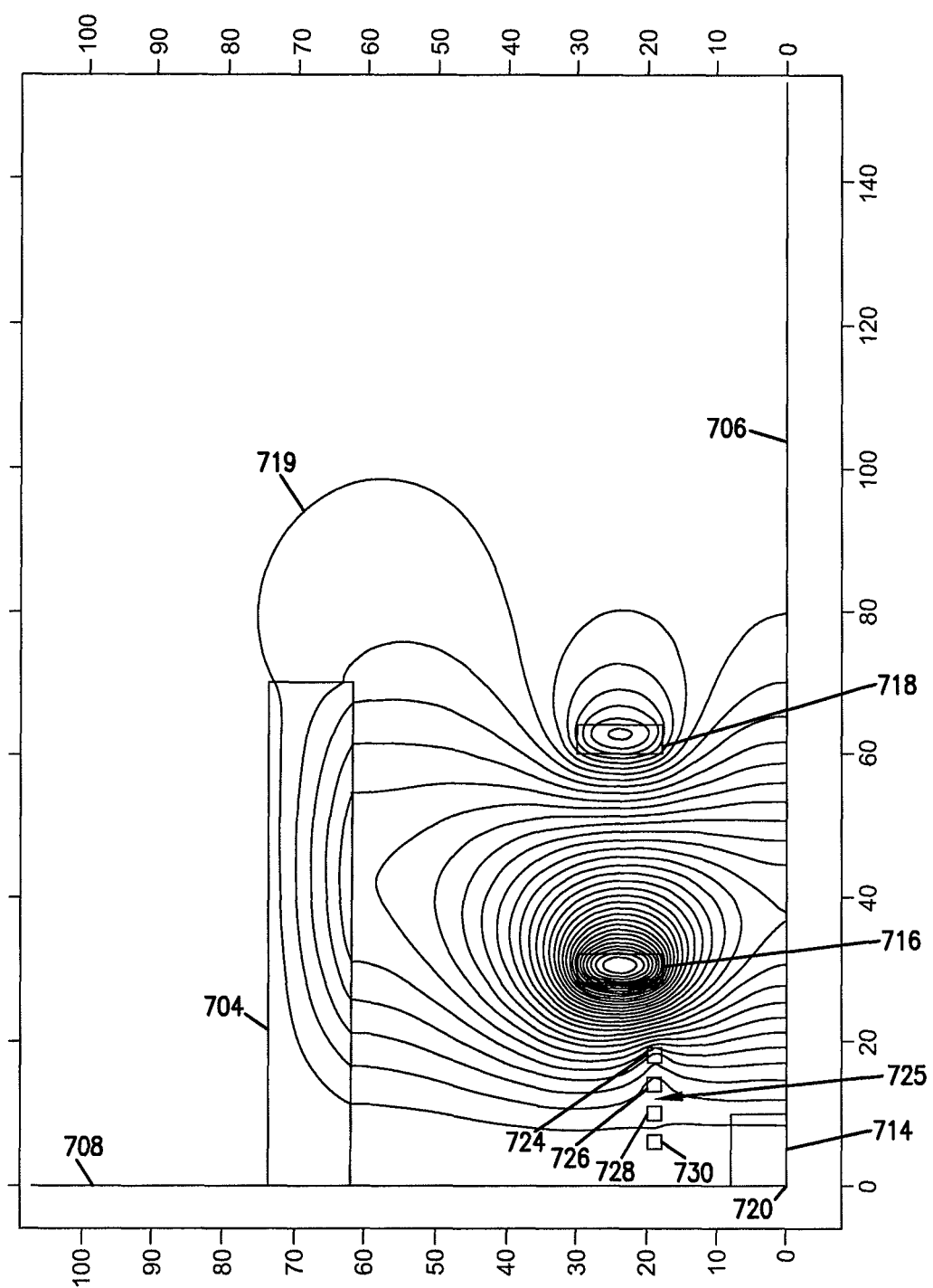
FIG. 7 is a second illustration of field lines produced in the embodiment of the present invention such as illustrated in FIG. 5.

With reference now to FIG. 7 of the Drawings, there is shown the field lines of the previous figure at the same field strength, albeit those field lines are now contained by the addition of an Iron end plate 704, which, as discussed in connection with FIG. 5, tends to suppress outlier field lines, such as field lines 619 in FIG. 6, particularly along the X axis 708. As clearly shown in FIG. 7, the leftward outlier field lines 719 are stopped at the Iron plate 704. A magnet assembly with this configuration can generally handle higher field strengths, e.g., about 1.5 or more Tesla field strengths. In particular, in this embodiment, the steel end plates 704 are located at about 62 inches from a patient point 720 (lower right corner of the figures) in the medial or X axis 708. It should be noted that the inclusion of the Iron better contains outlier fringe lines 719 along the X-axis 708 and along the Y-axis 706 as well. Additionally, corrective coils 724, 726, 728 and 730 better smooth the field in the imaging portion, i.e., patient area 714 about point 720, according to spacings 725 therebetween, removing inhomogeneities.

Figure 8:
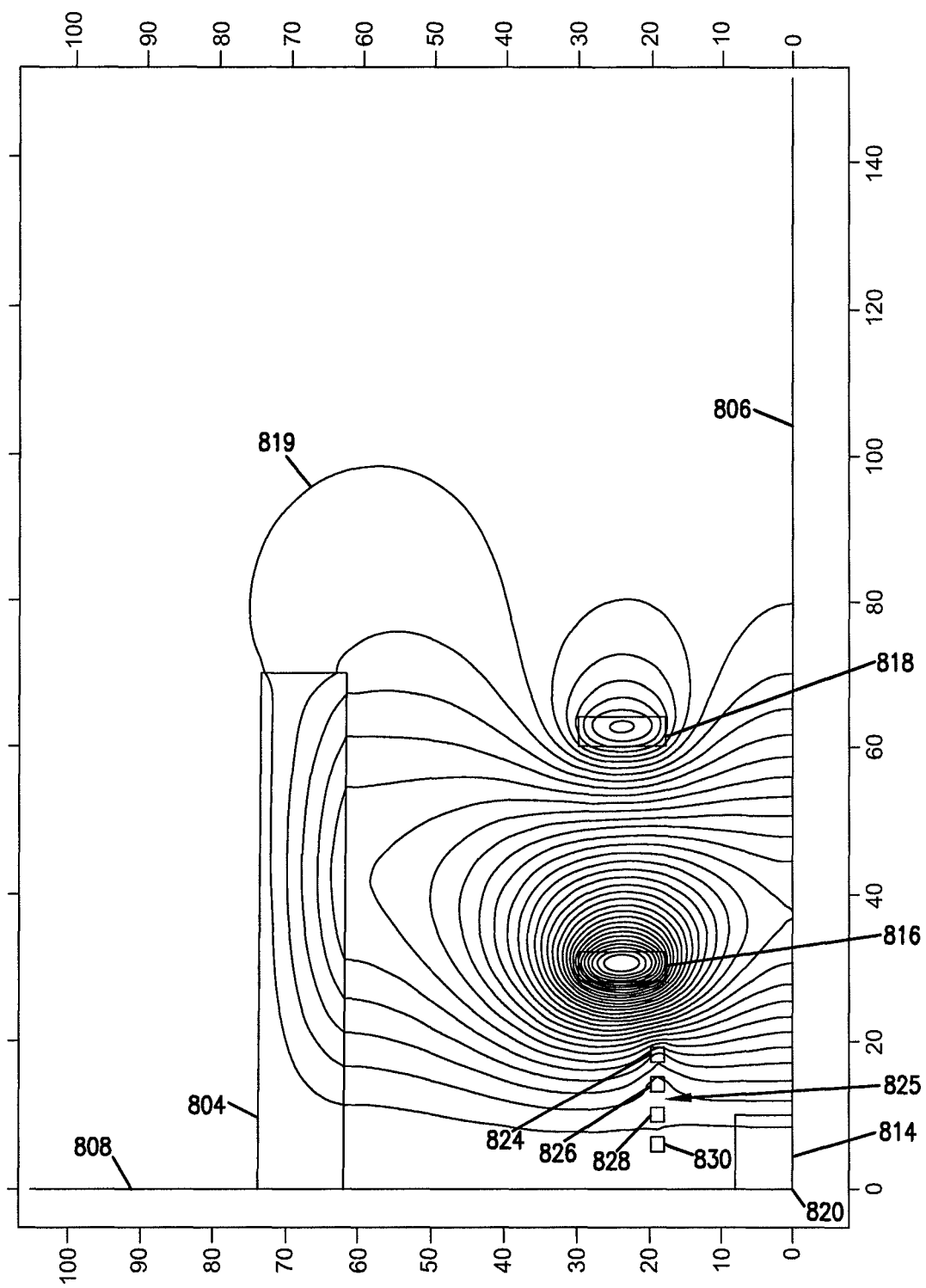
FIG. 8 is a third illustration of field lines produced in the embodiment of the present invention shown in FIG. 7 but at twice the current strength.

With reference now to FIG. 8 of the Drawings, there is shown the field lines of the previous figure but at double the current strength. As before, outlier field lines 819 are contained by the addition of an Iron end plate 804, which suppresses the outlier field lines. With the current increased, this modified configuration is able to handle up to about 3.1 Tesla field strengths. Furthermore, with this new geometry or configuration the maximum operating field is optional, i.e., the field strength is proportional to the strengths of the coils employed. Further, the corrective coils 824, 826, 828 and 830 strengthen and smooth the field lines in patient area 814 about point 820, according to spacings 825 therebetween.

Figure 9:
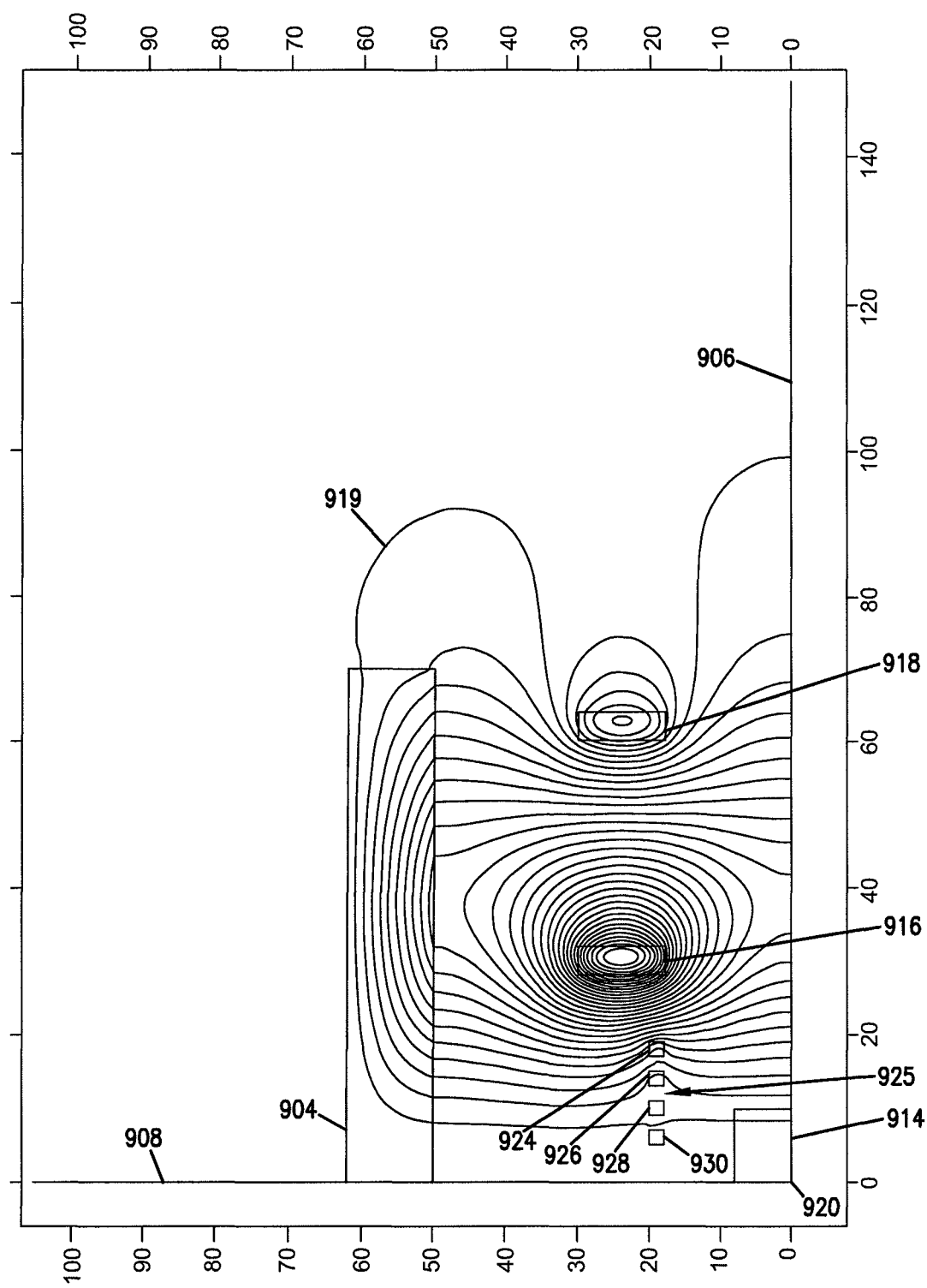
FIG. 9 is a fourth illustration of field lines produced in the embodiments of the present invention shown in FIGS. 7 and 8 but with a longer Iron sidewall.

With reference now to FIG. 9 of the Drawings, there is shown the field lines of the previous FIGS. 6 and 7 at the same strength, albeit those field lines 919 are now contained by the addition of a longer Iron end plate 904, which is also spaced closer to the poles, i.e., closure to primary coil 916 and secondary coil 918 along the X-axis 908. As illustrated, this configuration further suppresses outlier field lines, as illustrated. With further reference to FIG. 9, the end plate 904 or shielding in this embodiment is located at 50 inches instead of 62 inches (FIGS. 7 and 8) along the X-axis 908 from a patient point 920, producing a slightly higher field strength. Also, as is understood by those skilled in the art, a sextipole (P2) term here is slightly modified from the sextipole value for FIG. 7. Although the good field near the patient point 920 in this embodiment has been perturbed slightly, Applicants' have found that the corrective coils 924, 926, 928 and 930 can be adjusted and configured to easily correct for this perturbation, with calibrated spacings 925 therebetween. Nonetheless, as noted with FIGS. 7 and 8, moving the end plate 104 out to 62 inches eliminates this perturbation, which means that clean air core properties are independent of the current and scanning field.

Applicants, through their many efforts at improving MRI technology, set forth herein the instant description, illustrations and configurations of several new and much improved magnet configurations, which can take scanning to greater field intensities, particularly more than 1.5 Tesla and over 3 Tesla, as well as strengths in between, such as less than 0.5 T, 0.5 T-1.0 T, 1.0 T-1.5 T, 1.5 T-2.0 T, 2.0 T-2.5 T, 2.5 T-3.0 T, 3.0 T-3.1 T, 3.1 T-3.2 T, 3.2 T-3.5 T, 3.5 T-4.0 T and above 4.0 T. Furthermore, Applicants' UpRight® scanner technology coupled with this improvement offers enhanced scanning capability for patients whether standing, sitting, horizontal or at intermediate angles or orientations. The increased field strengths and improved control thereof allows for a new age of imaging and new ways to improve the diagnostic and therapeutic efforts of surgeons and other doctors to treat their patients.

The air core design enhanced by plane slab-like Iron end plates can constrain the leakage field beyond the Iron end plates and can also enhance the field of the scanner for given ampere turns in the coils. The longitudinal supports can also be of plane beam-like geometry. As such, they can return the flux beyond the longitudinal supports if made of Iron. This hybrid design uses a remote iron closed return structure to enhance the field and also to enhance the shielding capabilities.

In connection with the aforementioned improvements to the magnets and configurations in an MRI system, patients receiving various medical diagnoses or treatments often need to be positioned correctly to properly receive the diagnosis or treatment. For instance, MRI systems require that the portion of the anatomy to be scanned be positioned within a relatively small imaging volume, e.g., on or about point 320 in cavity 314. One problem with many current patient positioning systems is that it is difficult to consistently and accurately locate the patient within the imaging volume to obtain a high quality image of the anatomical region of interest in the designed position.

Furthermore, MRI scanners generally require the patient to be oriented with the long axis of the body in a horizontal position. However, other positions of the body, such as vertical, an in-between angle, the Trendelenburg or reverse Trendelenburg positions, or sitting are also desirable. Another problem is that some current systems are limited in the number of positions a patient can be located in and there is no simple method of changing positions quickly for a variety of patients. Although Fonar's current UpRight® scanner provides this level of functionality, the present invention, also by assignee Fonar, makes further improvements.

In particular, Applicants have developed an improved patient positioning system for use in MRI, which overcomes the problems of the prior art and which is set forth in more detail in Applicants' assignee's patent application, U.S. patent application Ser. No. 09/918,369, filed Jul. 30, 2001, which refers to U.S. patent application Ser. No. 08/978,084, filed Nov. 25, 1997, both of which are incorporated herein by reference.

Further advancements have been made to the positioning mechanisms, e.g., design changes to reflect implementations of the positioning devices, e.g., the UpRight® MRI patient positioning system, for use in high field strengths, e.g., 1 Tesla or higher, such as proposed herein.

For example and with further reference to FIG. 1, in the presence of a high magnetic field some electronic devices, such as motors and amplifiers, house for example in the drive portion 140, can experience abnormal operating conditions. Applicants' assignee found that during the initial development of the 0.6 Tesla UpRight® MRI scanner, the motor amplifiers, which were initially mounted to the rear of the Patient Positioning System, were acting erratically due to the elevated magnetic field, resulting in a decision to remove the amplifiers from the bed and package them in an enclosure to the rear of the scanner room, e.g., as the exterior component 144. The motors, however, which were located in the same environment, did not appear to experience the same problems, so the location was acceptable and there was no need to change their location.

Nonetheless, at higher elevated fields, such as 1 Tesla or more, the motors 140 and possibly some of the material types would have to change to remain within operational limits. The following are some of the changes that have been implemented in the new bed design to ameliorate or forestall problems. First, the current motor configuration should be removed and replaced with a hydraulic drive system. In particular, non-magnetic hydraulic drives are mounted to existing gear boxes, such as exterior component 144, which would require a remotely-located hydraulic pump delivering fluid to the drives via hoses, such as connector 146, which would be routed through cable carriers, as is understood in the art.

Another modification is to remotely locate conventional electric motors at a location distant from the elevated field, thereby avoiding many of the strong field effects. The rotational motion to the existing gear boxes would be transmitted using various techniques, such as a flexible shaft, routed to the bed base through a cable carrier, such as exterior component 144, similar to the approach that is used on the 0.6 T UpRight® system, a telescoping inline shaft, a straight shaft between remotely located motor and existing gearbox using a non-magnetic splined shaft, or a belt drive, delivering motion through a belt arrangement connected to a drive gear located toward the rear of the magnet room, represented by the connector 146.

Another modification to forestall problems is the removal of all metallic materials from the bed assembly 134. This includes drive gears, hardware and any other material that could potentially perturb the magnetic field. In particular, removal of all materials that in the presence of an elevated field would create problematic eddy currents or possibly cause harm to the patient 136 is necessary to preserve the stability of the field 121 during high strength operations. It should be understood that fiber optic circuits may need to be used in order to address some of these requirements.

Yet another ameliorative adjustment is to extend the travel distance of the bed base 142 more towards the front of the magnet room, thereby minimizing the exposure of the MRI technician to the elevated magnetic field. It should be understood that current design approaches which employ conventional ball screws would need to be substituted. Applicants have found that several techniques could be used to address this challenge, but the best solution would be to implement an "extended bed travel" belt drive approach that has been developed for experimental purposes.

Finally, a further modification to prior patient positioning systems is to implement a vertical drive feature 140 in the bed base 142 to allow vertical positioning of the patient during recumbent scans. Applicants have found that this feature would also be very helpful during inclined scans as well, and that the travel distance might only need to be approximately 4-6 inches.

It should be understood that the term "primary field" used in the text hereinabove and in the claims hereinbelow encompasses a combination of the field produced by the primary magnet coils with that of the field produced by the secondary magnet coils. The corrective or correction coils, as well as the shims, fine tune that combined field, which is loosely referred to as the primary field.

It should further be understood that the term "magnet" herein generally refers to magnetic coils and not permanent magnetic material.

While the present invention has been described in connection with a number of exemplary embodiments and implementations, the present invention is not so limited but rather covers various modifications and equivalent arrangements, which fall within the purview of the appended claims.

What is claimed is:

1. A magnetic resonance imaging system comprising:
   a magnetic device, said magnetic device comprising a primary magnet, a secondary magnet and a plurality of correction magnets,
   said primary magnet generating a primary field flowing through a patient-receiving portion therethrough, said primary field containing inhomogeneities within the patient-receiving portion and fringe fields outside thereof,
   said primary magnet comprising a first upper coil and a second lower coil,
   said secondary magnet generating a secondary field substantially countering said fringe fields produced by said primary magnet outside of said patient-receiving portion, and
   at least one of said plurality of correction magnets being flexibly positionable to substantially correct said inhomogeneities and straighten field lines associated with said primary field within said patient-receiving portion, thereby improving field uniformity,
   wherein said at least one of said plurality of correction magnets comprises at least one upper corrective coil and at least one lower corrective coil,
   wherein the distance between said first upper coil and said second lower coil is greater than the distance between said at least one upper corrective coil and said at least one lower corrective coil,
   said correction magnets placed within said primary field of said magnetic device and isocentrically aligned therein; and
   a patient positioning system, said patient positioning system adjustably positioning a patient within said patient-receiving portion.

2. The magnetic resonance imaging system according to claim 1, wherein said primary and secondary magnets are superconductive magnets.

3. The magnetic resonance imaging system according to claim 2, further comprising:
   a cooler, said cooler cooling said superconductive magnets to superconductive temperatures.

4. The magnetic resonance imaging system according to claim 3, wherein said cooler is selected from the group consisting of immersion cooling, thermal siphoning, conduction cooling and combinations thereof.

5. The magnetic resonance imaging system according to claim 3, further comprising:
   a first support, said first support supporting said primary, secondary and at least one correction magnet; and
   a second support, said second support supporting said cooler.

6. The magnetic resonance imaging system according to claim 1, wherein said plurality of correction magnets are superconducting magnets.

7. The magnetic resonance imaging system according to claim 6, further comprising:
   a cooler, said cooler cooling said superconductive magnets to superconductive temperatures.

8. The magnetic resonance imaging system according to claim 7, wherein said cooler is selected from the group consisting of immersion cooling, thermal siphoning, conduction cooling and combinations thereof.

9. The magnetic resonance imaging system according to claim 1, wherein said plurality of correction magnets are selected from the group consisting of at least three correction magnets, at least four correction magnets and at least five correction magnets.

10. The magnetic resonance imaging system according to claim 1, wherein respective correction magnets are spaced apart from one another in unequal spacings.

11. The magnetic resonance imaging system according to claim 10, wherein said spacings are determined dynamically.

12. The magnetic resonance imaging system according to claim 10, wherein said spacings are precomputed.

13. The magnetic resonance imaging system according to claim 1, wherein respective correction magnets have differing operational current strengths.

14. The magnetic resonance imaging system according to claim 1, further comprising:
   a frame, wherein said primary, secondary and plurality of correction magnets are secured to said frame.

15. The magnetic resonance imaging system according to claim 14, wherein said frame comprises a non-ferromagnetic material.

16. The magnetic resonance imaging system according to claim 15, wherein said non-ferromagnetic material is selected from the group consisting of concrete and aluminum.

17. The magnetic resonance imaging system according to claim 14, wherein at least a portion of said frame comprises Iron.

18. The magnetic resonance imaging system according to claim 1, wherein said primary field has a strength selected from the group consisting of less than 0.5 T, 0.5-1.0 T, 1.0-1.5 T, 1.5-2.0 T, 2.0-2.5 T, 2.5-3.0 T, 3.0 T-3.1 T, 3.1 T-3.2 T, 3.2 T-3.5 T, 3.5 T-4.0 T and above 4.0 T.

19. The magnetic resonance imaging system according to claim 1, further comprising:
   at least one shim, said shim placed substantially isocentrically within said primary field and adjacent at least one of said correction magnets.

* * * * *